(12) United States Patent
Pathak et al.

(10) Patent No.: US 6,809,550 B2
(45) Date of Patent: Oct. 26, 2004

(54) HIGH SPEED ZERO DC POWER PROGRAMMABLE LOGIC DEVICE (PLD) ARCHITECTURE

(75) Inventors: Saroj Pathak, Los Altos Hills, CA (US); James E. Payne, Boulder Creek, CA (US); Victor V. Nguyen, San Jose, CA (US); Harry H. Kuo, San Jose, CA (US)

(73) Assignee: Atmel Corporation, San Jose, CA (US)

( * ) Notice: Subject to any disclaimer, the term of this patent is extended or adjusted under 35 U.S.C. 154(b) by 26 days.

(21) Appl. No.: 10/251,402

(22) Filed: Sep. 20, 2002

(65) Prior Publication Data

US 2004/0056679 A1 Mar. 25, 2004

(51) Int. Cl.[7] ............................................. H03K 19/177
(52) U.S. Cl. ............................ 326/41; 326/45; 326/47
(58) Field of Search ........................ 326/37–41, 44–45, 326/47, 49–50

(56) References Cited

U.S. PATENT DOCUMENTS

| | | | |
|---|---|---|---|
| 4,124,899 A | 11/1978 | Birkner et al. | 364/716 |
| 4,684,830 A | 8/1987 | Tsui et al. | 307/465 |
| 4,703,206 A | 10/1987 | Cavlan | 326/41 |
| 4,922,411 A | 5/1990 | Hobbs | 365/155 |
| 4,959,564 A * | 9/1990 | Steele | 365/185.21 |
| 5,272,674 A | 12/1993 | Pathak et al. | 365/206 |
| 5,410,268 A | 4/1995 | Sharpe-Geisler | 327/51 |
| 5,440,508 A | 8/1995 | Pathak et al. | 365/154 |
| 5,532,623 A | 7/1996 | Advani et al. | 327/62 |
| 5,565,793 A | 10/1996 | Pedersen | 326/41 |
| 5,568,066 A | 10/1996 | Sharpe-Geisler et al. | 326/39 |
| 5,734,275 A | 3/1998 | Ashmore, Jr. | 327/51 |
| 5,909,125 A | 6/1999 | Kean | 326/39 |
| 5,963,496 A | 10/1999 | Pathak et al. | 365/207 |
| 5,974,242 A | 10/1999 | Damarla et al. | 395/500.03 |
| 6,038,194 A * | 3/2000 | Davies | 365/230.06 |
| RE36,952 E | 11/2000 | Zagar et al. | 326/44 |
| 6,236,230 B1 | 5/2001 | Marshall | 326/39 |
| 6,304,103 B1 * | 10/2001 | Kean | 326/41 |

OTHER PUBLICATIONS

Rhyne, Fundamentals of Digital Systems Design, N.J., 1973, pp. 70–71.*
Atmel, "High Performance EE PLD", ATF22V10B, ATF22V10BQ, ATV22v10BQL, Rev. 0250K–03/01, pp. 1–20.

* cited by examiner

*Primary Examiner*—James H. Cho
(74) *Attorney, Agent, or Firm*—Thomas Schneck; Mark Protsik

(57) ABSTRACT

A programmable logic device (PLD) architecture includes a plurality of PLD single-bit logic cells. Each single bit logic cell is comprised of all CMOS logic devices including a programmable cell unit, a settable latch, a signal path with inverter, and an output logic gate. The single path is coupled to the cell unit, the settable latch, and the output logic gate to create a positive feedback loop to improve speed and noise immunity. Each single bit logic gate is a basic building block for a modular low power consumption, high speed, zero DC current, high noise immunity programmable logic device (PLD) which includes an array of word lines and bit lines arranged in rows and columns for addressing, an array of OR gates, and a plurality of output logic circuits.

25 Claims, 8 Drawing Sheets

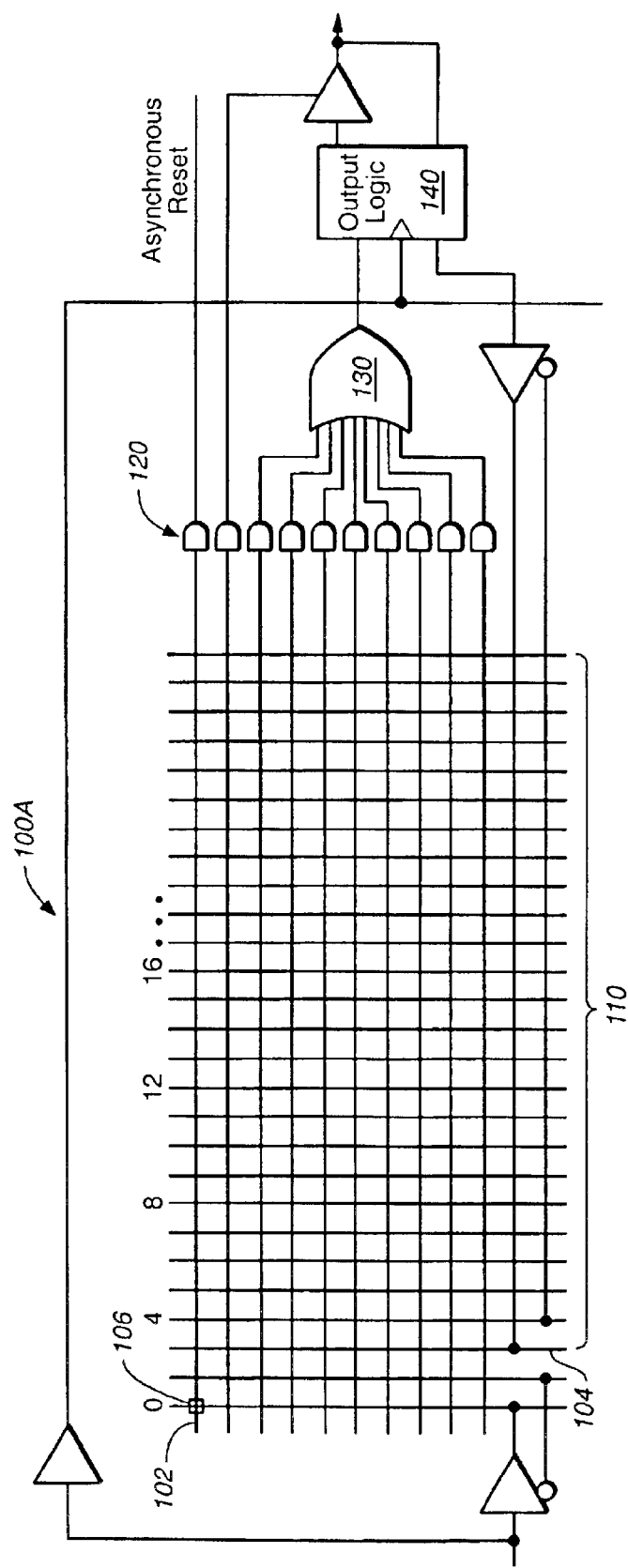
FIG._1A
(PRIOR ART)

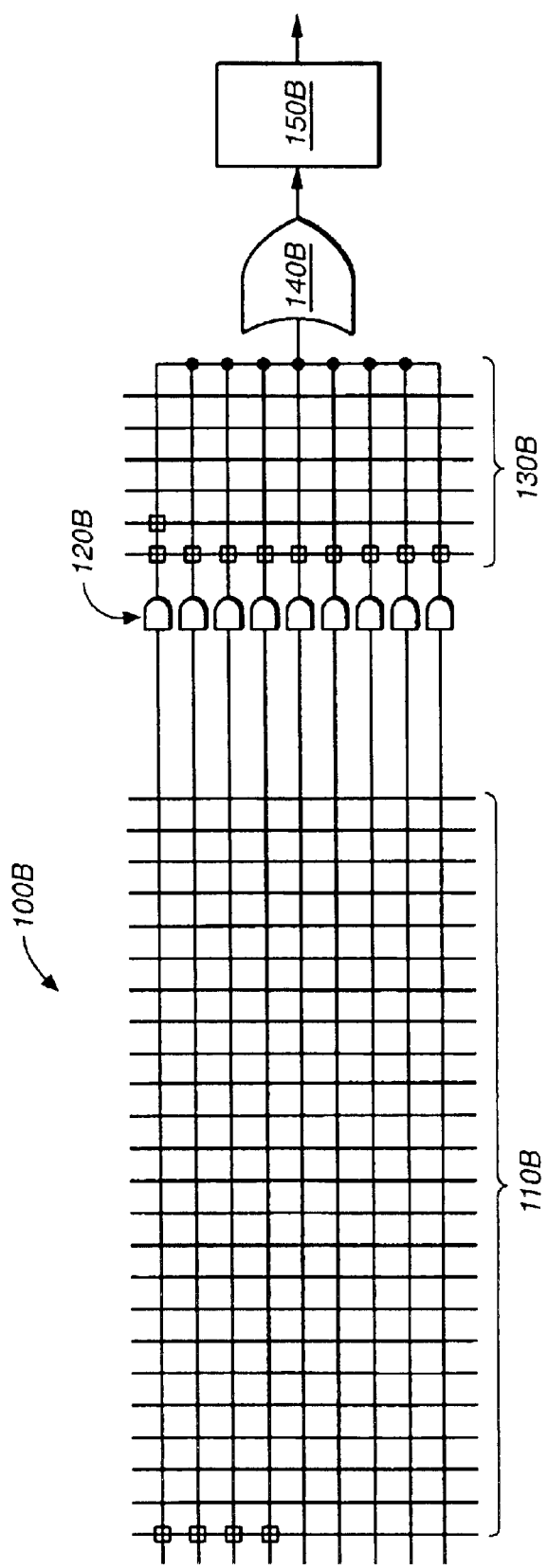
FIG._1B
(PRIOR ART)

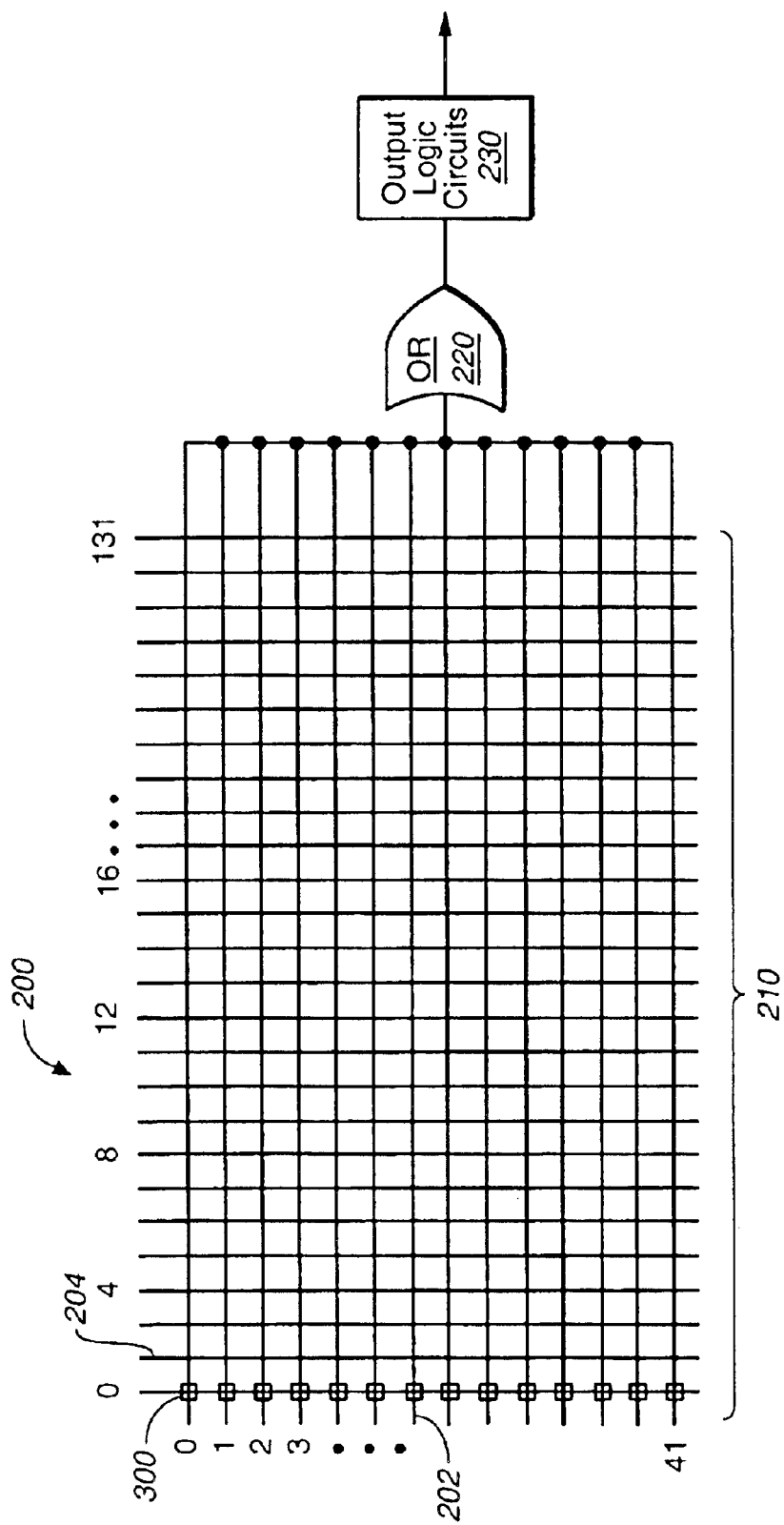
FIG._2

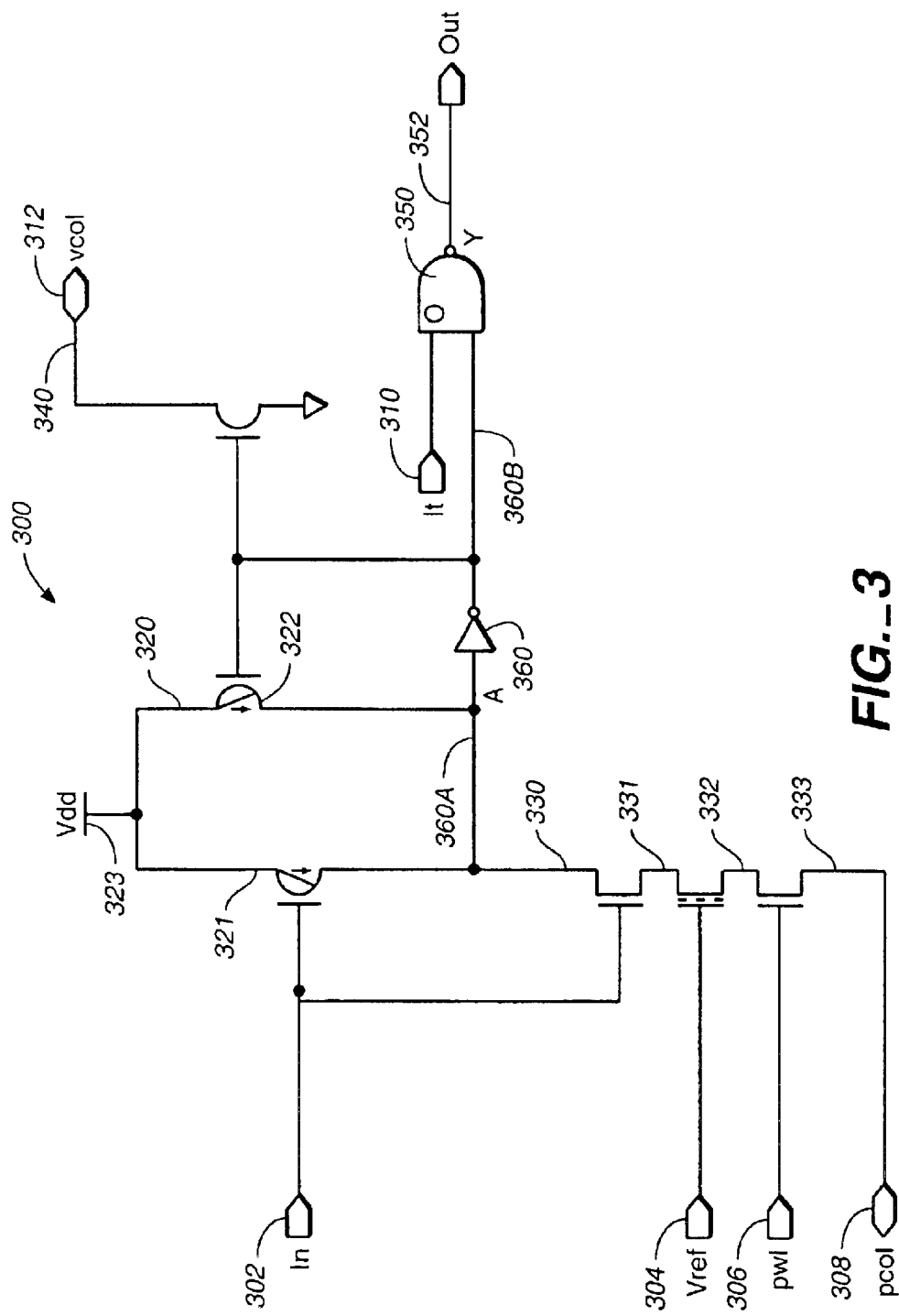
FIG._3

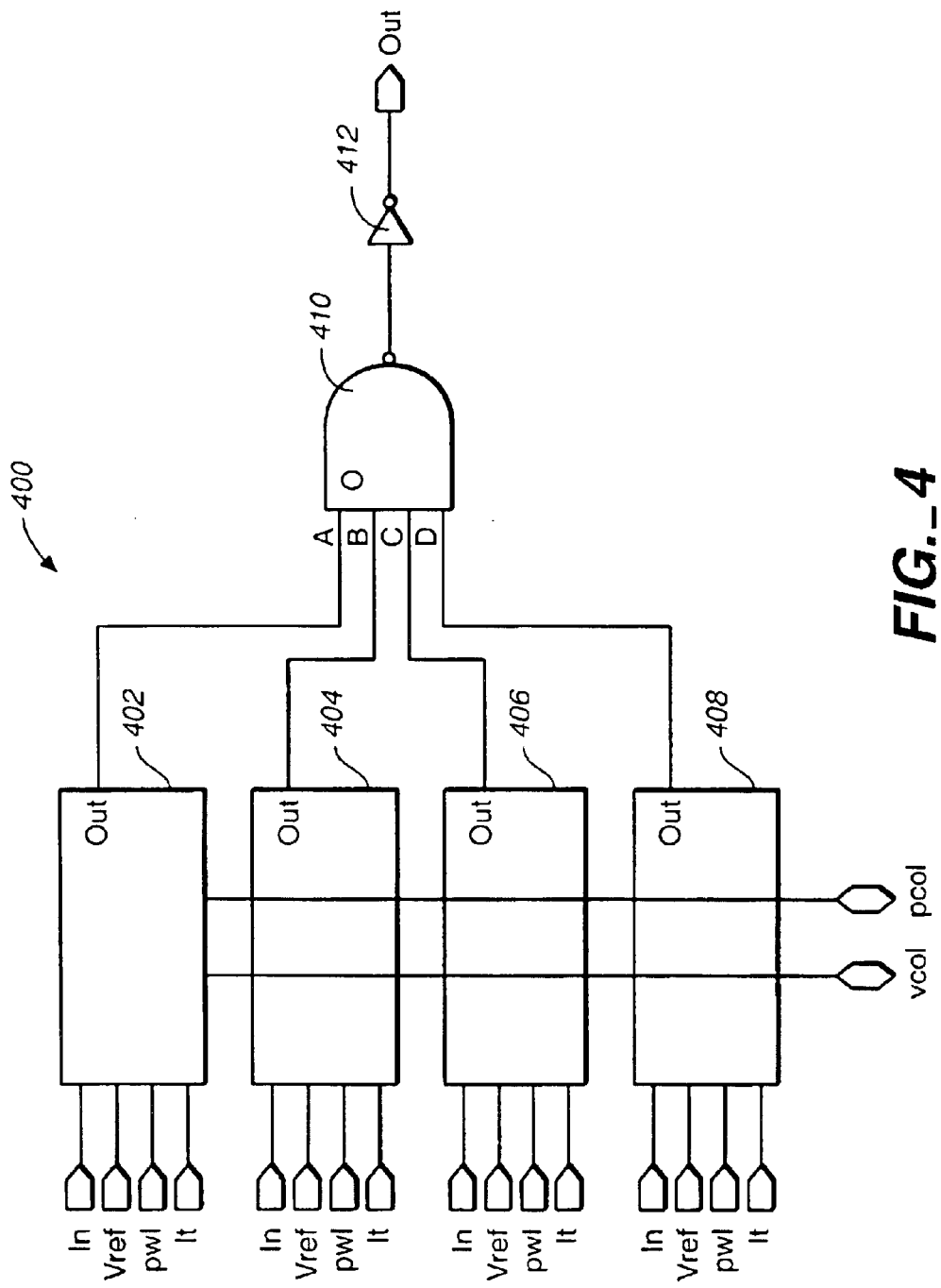
FIG._4

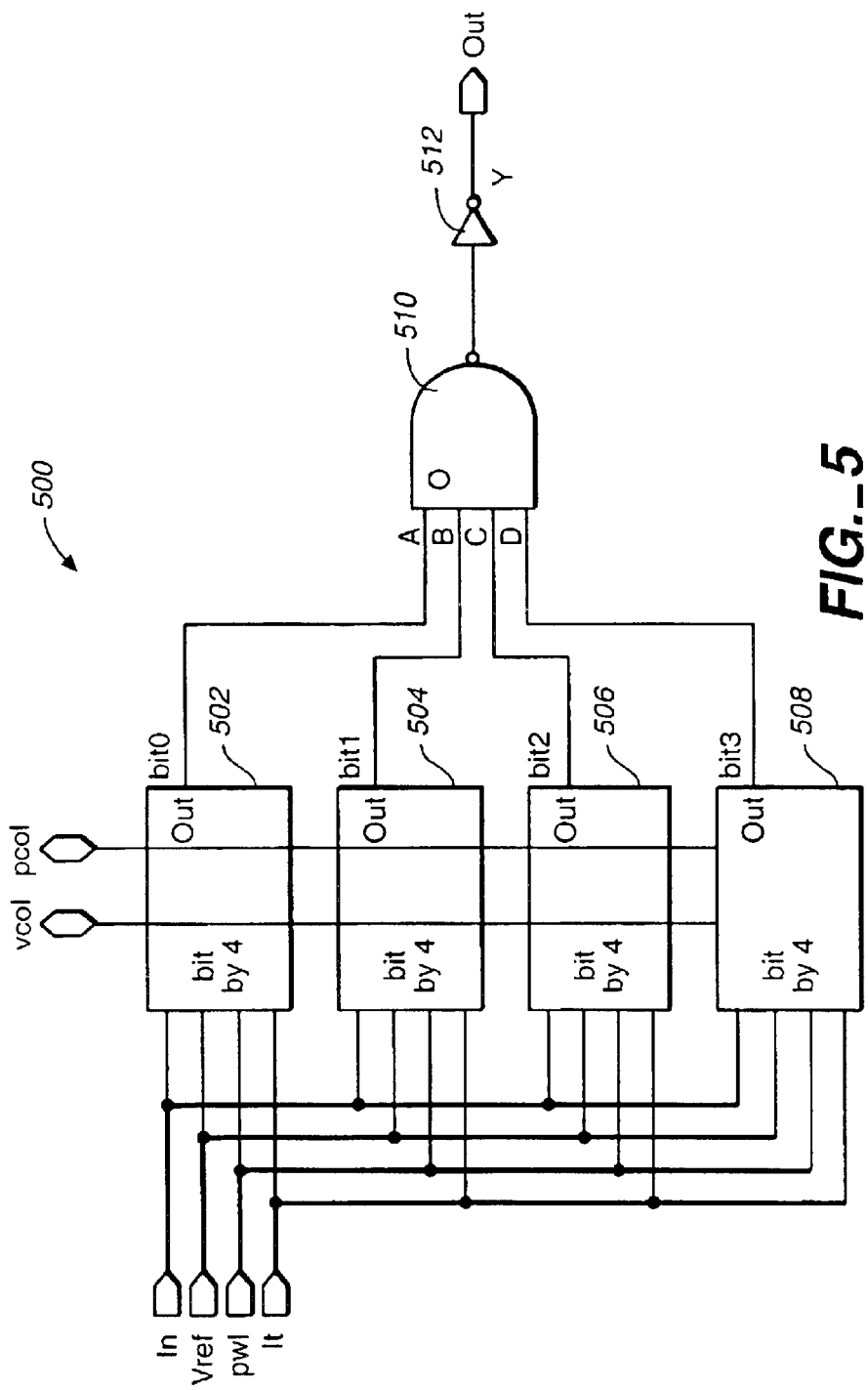
FIG._5

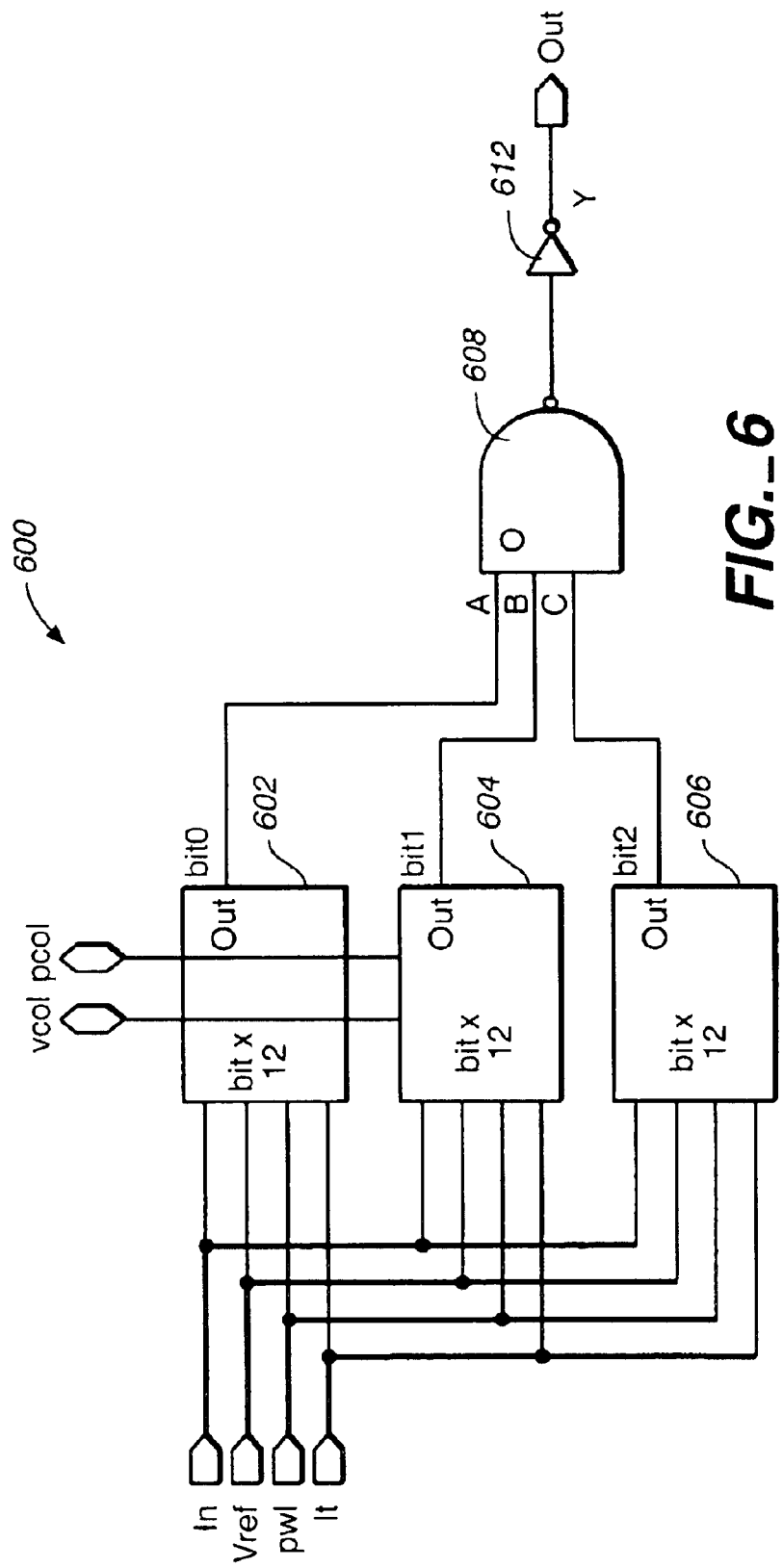
FIG._6

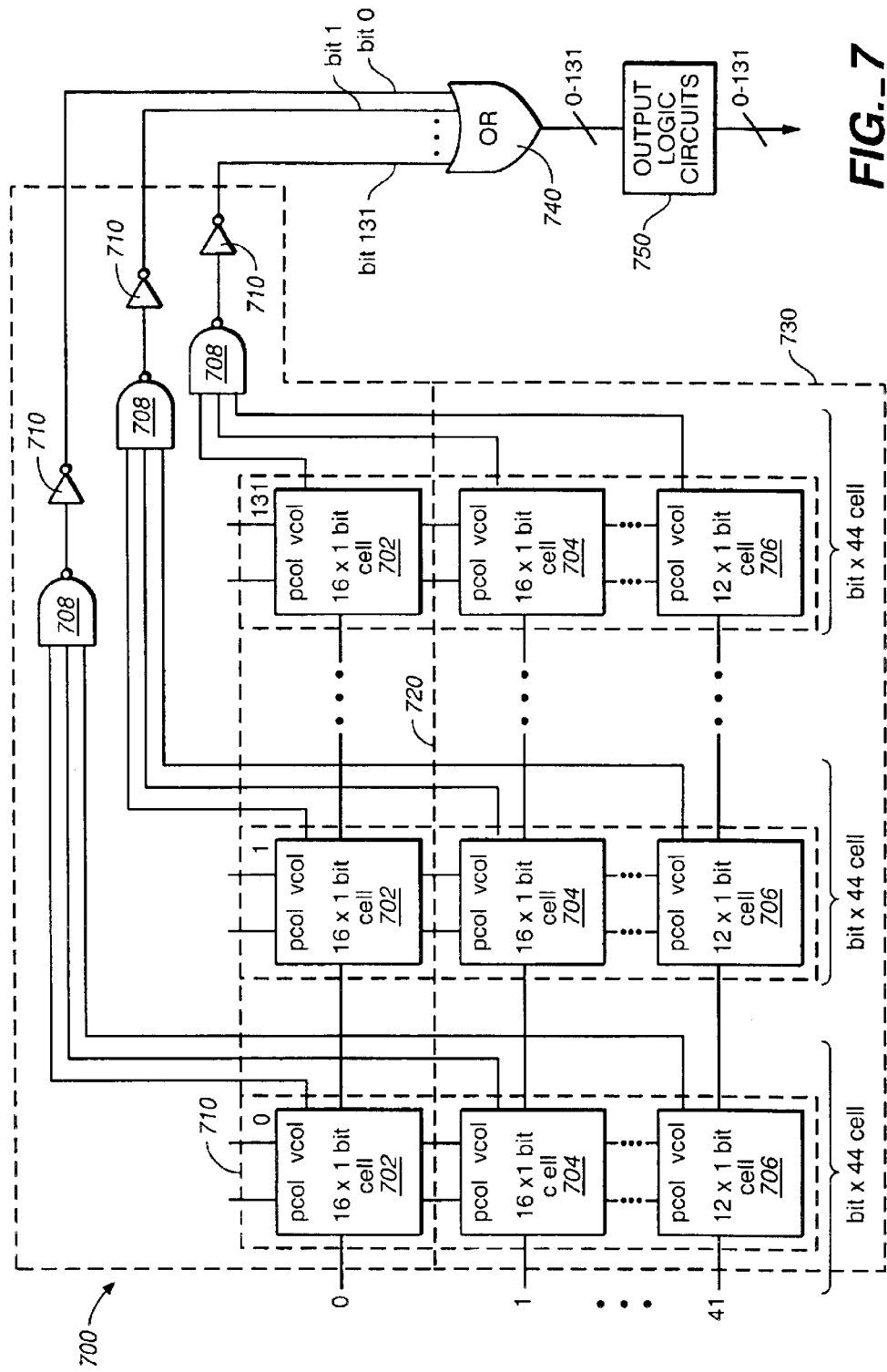

HIGH SPEED ZERO DC POWER PROGRAMMABLE LOGIC DEVICE (PLD) ARCHITECTURE

FIELD OF THE INVENTION

The invention broadly relates to programmable logic devices (PLD). More particularly, the invention relates to a high speed, zero DC power PLD architecture.

BACKGROUND OF THE INVENTION

Programmable logic devices (PLD) are well known in the art and are widely used to perform complex digital logic functions in the form of a sum of products, or a product of sums. Fundamentally, each PLD includes a memory array or matrix functioning as an programmable AND gates, a sensing circuitry, an array of fixed OR gates, and output logic circuits. The array of fixed OR gates can be also be a programmable OR array. When the row and column decoders select a specific cell from which to read or write data, a sense amplifier in the sensing circuitry reads the information from the selected cell and the fixed OR array and the output logic circuits to perform the logic function. When this happens, the bitlines of the programmable array connected to the selected cell is pulled low, or has high impedance. The sense amplifiers read out the information contained in that cell and pass it to the array of OR gates and then to the output logic circuits as outputs of the PLD.

With reference to FIG. 1A, a typical prior art programmable logic device (PLD) 100A comprises a programmable array 110 arranged in rows 102 and columns 104. The intersection of each row and column is a cell 106 and is programmed by either one-time fuselink method or by a floating-gate CMOS. The floating-gate CMOS cells can be UV or electrical erasable. The programmable array 110 is coupled to an array of sense amplifiers 120. The sense amplifiers 120 read the content of each of the selected cells and pass the information to an array of fixed OR gates 130. The array of fixed OR gates 130 is coupled to the output logic circuits 140. The output logic circuits 140 are usually clocked sequential circuits to latch out the outputs. This type of PLD is well-known in the art and is called a programmable array logic (PAL).

The sense amplifiers 120 of the PAL 100A consume a significant amount of power. When the PLD 100A is in the standby mode, the sense amplifiers 120 have to be ON so that they can read the contents of the selected cells when the PLD 100A is powered up. In this standby mode, sense amplifiers draw hundreds of milliamperes. Furthermore, the prior art PLD 100A has to go through several different stages such as the programmable array 110, the sense amplifier array 120, the array of fixed OR gates 130, and the logic output circuits 130 to complete the operation. This type of architecture is rather slow.

Another type of PLD is a programmable logic array (PLA) shown in FIG. 1B. The PLA 100B has a programmable array 110B, a first array of sense amplifiers 120B, a programmable OR array 130B, a second array of sense amplifiers represented by 140B) to read information from the programmable OR array 130B, and output logic circuits 150B. The PLA 100B is more flexible but slower in speed and consumes more power than the PAL 100A.

The number of conducting cells in the programmable array determines the speed and the power consumption of each PLD. The speed of each PLD depends on the number of cells that the sense amplifiers read. The speed also depends on the architecture of the PLD: the larger the programmable array, the slower the speed.

Ordinarily, in the standby mode, a PLD consumes about 100 mA of current to set the PLD chip ready for the next action. There is a need to reduce this power consumption because it shortens the life of a battery in products in which the PLD is used. Moreover, sense amplifiers consume a substantial amount of power during normal operation. Additionally, noise spikes often cause the PLD to read incorrect values to its output logic circuits. Therefore, there is a need to improve power consumption, speed, and noise immunity in PLD architecture.

There have been numerous attempts in the prior art to improve these performance factors in PLDs. U.S. Pat. No. 5,568,066 discloses a high density programmable logic device (PLD) including sense amplifiers and OR gates configured to increase speed, reduce number of transistors, and provide a selectable power-down mode. To achieve these features, the '066 patent uses sense amplifiers including a single cascode amplifier in the data path to connect a product term to the OR gates. The OR gates utilize a plurality of source-follower transistors followed by pass gates to provide logic allocation enabling the sense amplifier output to reduce from the 0 to 5 volts CMOS rails to increase switching speed while reducing transistor count. Amplifying inverters, normally provided in the sense amplifiers to provide the CMOS rail-to-rail switching and which would require complex feedback for providing power down on a macrocell-by-macrocell basis, are moved forward into OR output circuits. Power-down on a macrocell-by-macrocell basis is provided by selectively sizing the amplifying inverters in the output circuits. The '066 patent teaches a reduction of the number of transistors and a rail-to-rail voltage swing without a feedback mechanism.

U.S. Pat. No. 5,734,275 discloses a programmable logic device (PLD) having an improved sense amplifier. The sense amplifier comprises a cascode pair of transistors coupled between a sense amplifier output and a virtual ground. A clipping and current channeling transistor can also be provided with the sense amplifier to improve its noise performance. The clipping transistor helps ensure the any positive-going noise spikes do not deleteriously affect the accurate threshold triggering value of the input line. The current channeling transistor helps prevent collapse of a bit caused by significant conductivity of cells connected to the bitline. The combination of clipping and current channeling provides a relatively narrow voltage range of the bitline voltage, resulting in fast recovery and high speed sensing. The additional current source is used to impute additional current through the amplifying transistor of the cascode-coupled pair of transistors. The additional current sink transistor helps draw the current from the amplifying transistor to a ground supply. Only when a bitline is high will the additional current source and current sink be used. However, the '275 patent teaches improved sensing speed of the sense amplifier by providing a narrow voltage range of the bitline voltage. The noise performance of the circuit described in the '275 patent improves by clipping the positive going noise to avoid falsely triggering the sense amplifier.

Another attempt to solve the power consumption and speed in a PLD is disclosed in U.S. Pat. No. 5,532,623. In this patent, a sense amplifier includes a pull-down device which contains a reference cell which is structurally identical to the PLD cells being sensed and a pull-up device connected to form a current mirror which causes a saturation current of the pull-up device to be zero or greater than the current through the sensed-cell. The pull-down device has a saturation current which tracks the current through the sensed cell, saturation current through the pull-up device exceeds that of the pull-down device, and an output node is pulled up. When no current flows through the sensed cell, no current flows through the pull-up device, and the pull-down device pulls the output node down. As a result, the sense amplifier exhibits a variable trip point which tracks variations caused by changes in the device fabrication process, temperature, and power supply voltage. The reference cell in the sense amplifier conducts a current only during sensing, and therefore consumes no standby power. The '630 patent uses the reference cell and pull-up, pull-down devices to limit the flow of current into the sense amplifier to reduce the standby power consumption to zero.

It is the object of the present invention to provide an improved PLD architecture that has low overall power consumption, high speed, and good noise immunity.

SUMMARY OF THE INVENTION

The above objects have been achieved in a high speed programmable logic device (PLD) architecture that is implemented entirely in CMOS components arranged so that the device does not use power in a standby mode. According to one embodiment of the invention, the PLD comprises a plurality of programmable logic device (PLD) single-bit cells forming a programmable array. Each PLD single-bit cell is the basic building block of the programmable array. From a PLD single-bit cell, any M×N programmable OR or AND array can be implemented. Each PLD single-bit cell combines a single-bit memory cell and a sense amplifier together so that the PLD does not have to traverse through the selected cells and read them into the sensing circuitry as prior art PLDs.

Each PLD single-bit cell of the present invention includes a settable latch, a programmable cell unit, an output logic gate, and a signal-path means coupled between the programmable cell unit and the output logic gate for providing a positive feedback thereto. The device further comprises an array of OR gates and an output sequential circuits. Preferably, each column of the programmable AND array is a bit-by-44 cell whose output is coupled to the array of OR gates. The array of OR gates is coupled to the output logic circuit for outputs of the PLD. Each bit-by-44 cell gate further comprises of two bit-by-16 cells and one bit-by-12 cell. Each bit-by-16 cell further comprises four bit-by-4 cells, and each bit-by-12 cell comprises three bit-by-4 cells. A bit-by-4 cell comprises a four PLD single bit cells. The array of OR gates can be either fixed or programmable.

BRIEF DESCRIPTION OF THE DRAWINGS

FIG. 1A is an electrical schematic diagram of a prior art programmable logic device using an array of fixed OR gates.

FIG. 1B is an electrical schematic diagram of a prior art programmable logic device using an array of programmable OR gates.

FIG. 2 is an electrical schematic diagram of a 132×44 programmable logic device using a PLD single-bit cell according to the present invention.

FIG. 3 is an electrical schematic of a programmable logic device (PLD) single-bit cell according to the present invention.

FIG. 4 is an electrical schematic of a bit-by 4 logic cell including four single-bit logic cells of FIG. 3.

FIG. 5 is an electrical schematic of a bit-by-16 logic cell including four bit-by-4 logic cells of FIG. 4.

FIG. 6 is an electrical schematic of a bit-by-44 logic cell of one array column including two bit-by-16 logic cells of FIG. 5 and one bit-by-12 logic cell.

FIG. 7 is an electrical schematic of a 44×132 PLD using logic cells of FIG. 3 according to the present invention.

BEST MODE FOR CARRYING OUT THE INVENTION

With reference to FIG. 2, a new PLD architecture 200 is implemented by using a PLD single-bit cell as a basic building block to build the programmable array. As any prior art PLD, the PLD 200 has a programmable array 210, the array of OR gates 220, and an output logic circuits 230. However, the programmable array 210 of the PLD 200 is constructed by using a plurality of PLD single-bit cells 300. The description of the PLD single-bit cells 300 will be described in detail later. In the preferred embodiment, the PLD 200 has 44 rows and 132 columns.

In FIG. 2, each PLD single-bit cell 300 is represented by a square at the intersection between each row 202 and column 204. The total number of rows and columns of cells 300 in a PLD device is a matter of design choice and may vary according to customer needs. The PLD in FIG. 2, with its 5808 cells arranged in an array 210 of 44 rows and 132 columns is exemplary. Each column 204 can be constructed by a 44×1 cell. A 44×1 cell is composed of two 16×1 cells and one 12×1 cell. Each 16×1 cell has four 4×1 cells and each 12×1 cell has three 4×1 cells. Each 4×1 cell includes four single PLD single-bit cells 300. Thus, according to the invention, the entire programmable array 210 can be implemented by a plurality of PLD single-bit cells 300.

With reference to FIG. 3, single-bit programmable logic device (PLD) cell 300 is the basic building block of the programmable logic device PLD 200 according to the present invention. Each PLD single-bit cell 300 is represented by a square 300 in FIG. 2. The PLD single-bit cell 300 is constructed entirely of CMOS devices and functions as an addressed intersection in the memory array. The PLD single-bit cell 300 is comprised entirely CMOS transistors that operate in either cut-off or saturating regions; therefore, it draws virtually zero DC current. Furthermore, the internal positive feedback within the PLD single-bit cell 300 improves noise immunity and the speed of the PLD single-bit cell 300.

Each PLD single-bit cell 300 includes a settable latch 320, a programmable cell 330, a signal-path means 360, and an output gate 350.

In a preferred embodiment, the PLD single-bit cell 300 also includes a logic circuits 340, for verifying the array content. The PLD single-bit cell 300 has four input terminals: input IN 302, input-term IT 310, voltage reference Vref 304, programming word line PWL 306; two IN/OUT terminals: programming column PCOL 308 and voltage column VCOL 312; and an output terminal (OUT) 352. Also, in the preferred embodiment, the settable latch 230 is a sense amplifier and the programmable cell 330 is a flash cell.

The sense amplifier latch 320 comprises a differential pair including a first p-channel CMOS transistor 321 coupled to a second p-channel CMOS transistor 322. The drain of the transistor 321 is coupled to the drain of the second transistor 322 and to a power supplies Vdd 323. A typical value of Vdd for a CMOS transistor circuit is 5 volts. The source of the first transistor 321 is coupled to the source of the second transistor 322 and to the signal-path means 360. In the preferred embodiment of the invention shown in FIG. 2, the signal-path means is a CMOS inverter 360 having an input terminal 360A and an output terminal 360B. The gate of the first p-channel CMOS transistor 321 forms the input port IN 302 of the PLD single-bit cell 300, while the gate of the second transistor 322 is coupled to an output terminal 360B of the inverter 360, forming a positive feedback loop between the input and output of the inverter 360 to improve the noise immunity and the speed of the PLD single-bit cell 300. In the preferred embodiment shown in FIG. 3, the means for verifying array content is an N channel CMOS transistor 340 whose gate is coupled to the output terminal 360B of the inverter 360 and to the gate of the p-channel CMOS transistor 322. The drain of the transistor 340 forms the VCOL input 312.

The flash cell unit 330 comprises a first N channel CMOS transistor 331, a floating gate transistor 332, and a second N channel CMOS transistor 333, all coupled in series. The gate of the transistor 331 is coupled to the gate of the p-channel MOS transistor 321 and to the IN terminal 302; the drain of the transistor 331 is coupled to the source of the transistor 321 and to the input terminal 360A of the signal path means 360. The source of the transistor 331 is coupled to the drain of the floating gate transistor 332, while the gate of the transistor 332 is connected to the Vref input 304. The source of the transistor 332 is coupled to the drain of the transistor 333, and the gate of the transistor 333 is coupled to the PWL input 306 and its source terminal is coupled to the PCOL input 308.

In the preferred embodiment shown in FIG. 3, the output gate 350 is a CMOS NAND gate having two input terminals, one of which is the IT terminal 310 and the other one coupled to the output 360B of the inverter 360.

Referring again to FIG. 3, the IN terminal 302 controls whether the PLD single-bit cell 300 is either in the read or write mode. When the input on the IN terminal 302 is a logic LOW or OFF, the PLD single-bit cell 300 is in the write mode. When the IN terminal is OFF, the transistor 321 turns ON and the transistor 331 is OFF. The drain of the floating gate transistor 332 is floating. The flash cell unit 330 is cutoff from the input terminal 360A of the signal-path means 360 or the CMOS inverter 360. As a result, the input terminal 360A of the inverter 360 is HIGH and its output terminal 360B is LOW. Therefore, the output 352 of the NAND gate 350 is always HIGH regardless of the state of the input term (IT) 310. The second pull-up p-channel CMOS 322 pulls the input terminal 360A to above the threshold voltage Vdd/2 very quickly by means of the positive feedback loop formed by the output terminal 360B of the CMOS inverter 360 and the source of the second p-channel CMOS transistor 322. Thus, the positive feedback loop improves the speed as well as the noise immunity of the PLD single-bit cell 300.

While the transistor 331 is cutoff from the input terminal 360A of the inverter 360 and from the flash cell unit 330, the programming word line (PWL) terminal 360 and the programming column (PCOL) terminal 308 are both set to a HIGH voltage level such as Vdd to select this PLD single-bit cell 300. A selected PLD single-bit cell is represented by a square 204 at the intersection between a wordline and a bitline of the PLD 200 shown in FIG. 2. Depending on the values of Vref 304 and PWL 306, the floating gate transistor 332 is either programmed or erased. When the floating transistor 332 is programmed, the PWL terminal 306 of the transistor 306 is set to a voltage such as VddP that the voltage differential between the Vref, the drain, and the source of the floating gate transistor 332 causes its channel hot electrons to be injected into its floating gate, shifting the threshold voltage Vt of the flash cell 304 outward, and making it more difficult to turn on the floating gate transistor 332. In this case, the flash cell unit 330 stores a logic "0". In order to erase, the PWL terminal 306 is set to another voltage such as VddE so that the voltage difference from the source, the gate, and the drain of the floating gate transistor 332 creates an electric field across its thin layer of the layer of tunnel oxide. This effectively pulls electrons from the floating gate, returning the normal threshold VT threshold to the flash cell 304. Therefore, it is easier to turn on the floating gate transistor 332. In this case, the flash cell 330 stores a logic "1". This method of programming and erasing the flash cell by injecting hot electrons into the floating gate of a flash cell is called Fowler-Nordheims tunneling effect well known in the art. The specific voltage differences between the drain, gate, and source of the floating gate transistor, to either program or erase the floating gate transistor 332, depend on the design requirements of the cells and manufacturers.

When the IN terminal 302 is LOW, meaning that the PLD single-bit cell 300 is in the write mode, the output terminal 360B is LOW. This causes the N channel CMOS transistor 340 to be in the cutoff state and the VCOL terminal 312 to be zero. In this situation, the p-channel differential pair 321 and 322 is both HIGH, pulling the input terminal 360A of the CMOS inverter 360 very quickly above the threshold voltage Vdd/2 of CMOS devices. Therefore, undesired noise spikes cannot affect the logic of the PLD single-bit cell 300.

On the other hand, when the IN terminal 302 is HIGH or logic "1", the p-channel CMOS transistor differential pair 321 and 322 is cutoff, and the N channel CMOS transistor 331 is ON. This represents the read mode. At this time, the PWL 308 is set to a read voltage VddR so that the voltage differential between the drain, gate or Vref, and source of the floating gate transistor 332 causes the floating gate to reads out the electrical information. The sense amplifier latch 320 reads out the content of the floating gate transistor 332 into the signal path means 360.

The input term (IT) 310 is used to set the term of the PLD single-bit cell 300. When IT 310 is LOW or logic "0", the output 352 of the output NAND gate 350 is always HIGH or logic "1". Thus, if the output 352 of the NAND gate 350 is one of the multiple inputs to a following stage AND gate, this HIGH input has no effect on the output of this AND gate. On the other hand, if the IT 302 is HIGH or logic "1", the NAND gate 350 is an inverter. Thus, when IT is set to HIGH, the NAND gate 350 inverts the output of the inverter 360. This reflects the correct programmed state of the floating gate transistor 332 at the output terminal of the NAND gate 350. On the other hand, when the PWL terminal 306 is set to a read voltage, the threshold voltage VT of the transistor 304 is low and the flash cell 330 is easy to turn on. As a result, the output terminal of the NAND gate 350 is high. Therefore, the IT terminal sets the PLD single-bit cell 300 in standby mode to logic "0" and active mode to logic "1".

The means for verifying array content, VCOL, is the open drain transistor 340. This transistor 340 operates as a switch. When the content of flash cell unit 330 is HIGH, the output of the inverter 360 is LOW, and the transistor 340 is cutoff, VCOL reads LOW. On the other hand, when the content of the flash cell unit 330 is LOW, the output of the inverter 360 is HIGH, and the transistor 340 is ON, and thus VCOL reads HIGH. Thus, the transistor 340 verifies the programming voltage VT of the flash cell unit. When VT is HIGH or the flash cell 330 is in LOW state, the output terminal 360B of the inverter 360 is HIGH, and the VCOL is HIGH. On the other hand, when VT is LOW or the flash cell unit 330 is HIGH, the output terminal 360B of the inverter 360 is LOW, and VCOL reads LOW.

The operation of the PLD single-bit cell 300 is summarized in table 1 below: (Note that "X" is a "don't care" value).

TABLE 1

| IN 302 | IT 310 | PWL 306 | Vref 304 | PCOL 308 | VCOL 312 | Flash Cell Unit 330 | OUT 352 |
|---|---|---|---|---|---|---|---|
| X | 0 | X | X | X | X | X | HIGH (standby) |
| 0 | HIGH | VddP | Vref | VddP | HIGH | Programmed | HIGH |
| 0 | HIGH | VddE | Vref | VddE | LOW | Erased | HIGH |
| HIGH | HIGH | VddP | Vref | VddP | HIGH | Programmed | Read Low |
| HIGH | HIGH | VddE | Vref | VddE | LOW | Erased | Read High |

In the first row of Table 1, when the IT 310 terminal is zero, the output of the NAND gate is always "1" regardless of the values of other terminals. Therefore, other terminals in the table are in an "X" or "don't care" state and the output is always HIGH. The PLD single-bit cell 300 is in the standby mode.

In the second and third rows of Table 1, when IN 302 is LOW or logic "1" and when IT terminal is HIGH, the NAND gate 350 is an inverter, the PLD single-bit cell 300 is in the write mode. In the write mode, the PLD single-bit cell can be either programmed or erased.

When the IN terminal 302 is zero, the output terminal of the NAND gate 350 is always HIGH regardless of the values of other terminals. The PLD single-bit cell 300 is in the write mode. In the second row, when the PWL terminal 306 is HIGH, the word line or row is selected. When the particular PCOL 308 is selected, that particular cell is selected and programmed. In both situations, the VCOL 312 is HIGH because the threshold voltage VT of the flash cell 330 is HIGH after the programming. The specific voltage values of Vref, Vdd, and VddP each depends on the particular design of the cell type and manufacturer.

The third row of Table 1 represents a situation when the flash cell 330 is in the write/erase mode. The PCOL terminal 308 and the PWL 306 are set to different HIGH voltage such as VddE so that the differential voltages between the drain, gate, source of the floating gate transistor 332 would cause the cell to erase. The floating gate transistor 332 is a transistor in a cascode arrangement with its gate fixed to Vref, the source is input voltage, and the drain is output. Depending the voltages of the PWL, PCOL the source will have different voltages.

In the fourth and fifth rows of Table 1, when IN terminal 302 is HIGH, and when IT terminal 310 is HIGH, the PLD single-bit cell 300 is in the read mode: the output 352 reads out whether the HIGH cell unit 330 is programmed or erased. The PLD single-bit cell 300 reads out the content of the flash cell unit 100. The PWL PCOL terminals are set to VddP. The PWL terminal 306 and the PCOL terminal 308 are set to VddE. Therefore, the VCOL terminal 312 is HIGH and the out 352 is LOW. The fifth row, the PLD single-bit cell 300 is in read/erased mode. Therefore, OUT 352 is HIGH and VCOL is LOW.

Referring to FIG. 4, each of the PLD single-bit cell 300 described above is represented by a block having four input terminals Vref, PWL, IT, IN, and two I/O terminals PCOL, VCOL and one output terminal OUT. Each block represents one bit, one intersection, or one memory cell represented by a circle 300 in FIG. 2. Four PLD single-bit cell blocks are connected to form a PLD bit-by-4 (bit by four) cell 400. In FIG. 2, the PLD bit-by-4 400 is represented by any four squares or four intersections from 0–3, 4–7, etc. The bit-by-4 cell 400 functions like a four input AND gate and comprises four PLD single-bit cells, 402, 404, 406, and 408. Each PLD single-bit cell functions as described above in FIG. 2. All PCOL and VCOL terminals in the bit-by-4 cell 400 are coupled together. As such, the bit-by-4 cell 400 represents four bits within one column. When PCOL is HIGH, all bits in that column are selected, and depending on the value of the PWL terminal in each PLD bit, a specific cell of any of these four bits can be selected. For example, if the PCOL is HIGH and the PWL terminal of the PLD single-bit cell 402 is HIGH, then the top cell is selected. In the case when the PWL terminal of the third bit is HIGH, the third bit 406 is selected. The output terminals of the four boxes 402, 404, 406 and 408 are coupled to a 4-input NAND gate 410. The output of the NAND gate 410 is coupled to the input of an inverter 412.

As discussed above, when the IT terminal of any of the PLD bit in the bit-by-4 400 is a logic LOW, the corresponding input to the NAND gate 450 is always HIGH. A HIGH input does not affect the output of the NAND gate 410. Thus, that bit is in standby state. When the IT terminal is toggled to logic HIGH, the NAND gate 450 becomes an inverter. When any of the IN terminal of the PLD bit 402 to 408 is LOW, the PLD single-bit cell is in the programming mode. In this mode, the flash cell unit 430 is either programmed or erased. But when the any of the IN terminal is switched to HIGH, the PLD single-bit cell 300 is in the reading mode. All circuit components of the PLD bit are either CMOS pull-up or pull-down transistors. Thus, the PLD single-bit cells 402 to 408 do not draw any DC current because CMOS transistor only draws current in active region. In other words, the bit-by-4 300 does not consume any power because each of the cells 402 to 408 does not consume any DC power. Furthermore, the built-in positive feedback in each PLD bits 402 to 408 improves the speed and noise immunity for the PLD bit-by-4 logic cell 400. The Vdd/2 to zero rail-to-rail voltage in the logic cell significantly reduces the power consumption.

The operation of the bit-by-4 logic cell 400 from the NAND gate 410 to the inverter 412 is self-explanatory and well known in the art. For example, if any of the inputs to the NAND gate is LOW, the output of the NAND gate 410 is HIGH or "1". The output of the inverter is zero. The output of the inverter 412 only goes HIGH when all four bit inputs to the NAND gate 410 are HIGH.

With reference to FIG. 5, a bit-by-16 logic cell 500 is constructed and operates similarly to the bit-by-4 logic cell 400 discussed above. The bit-by-16 cell 500 comprises four bit-by-4 cells 400, a NAND gate 510 coupled to an inverter 512. Because the bit-by-16 cell 500 is built from the basic building block single-bit logic cell 300, it has the same electrical and noise characteristics of the PLD single-bit 300 and the bit-by-4 cell 400. Therefore, the bit-by-16 cell 500 also has high speed, high noise immunity, and consumes zero DC power.

In the pertinent art, the PLD single-bit cell 300 can be used as the basic building block to build any programmable memory array of finite dimension N, where N is an integer greater than 1. This programmable memory array implemented from a 300 plurality of PLD single-bit cells 300 is called a bit-by-N. In the preferred embodiment, N is selected to be 44. And the bit-by-44 is implemented as described below.

In FIG. 6, a bit-by-44 cell 600 is comprised of two bit-by-16 logic cell 602 and 603, one bit-by-12 logic cell

606, a NAND gate 608, and an inverter 610. The two bit-by-16-logic cell are constructed as shown in FIG. 5, and the bit-by-12 logic cell is constructed by three bit-by-4logic cells 400 in the same fashions as the bit-by-4, bit-by-16, and bit-by-44 are built from the PLD single-bit cells.

With reference to FIG. 7, the PLD architecture 700 has an array of programmable AND gates 730, an array of fixed OR gates 740, and a plurality of output logic circuits 750. The array of programmable AND gates 730 is constructed by using the plurality PLD single-bit cell 300 as described in FIG. 3.

The programmable array 730 is arranged in rows 720 and columns 710. In the preferred embodiment, the PLD architecture has 44 rows and 132 columns. Each column 710 is a 44-by-1 cell as described in FIG. 6. Each column 710 comprises two 16-by-1 cells 704 and one 12-by-1 706 cell. The PLD 700 has 132 of such columns. In other words, each row 720 comprises 132 16-by-1 cells. The intersections of the column 710 and the row 720 is a cell. A cell is selected by driving PWL and PCOL to HIGH. When a PWL is HIGH, the whole row 720 is selected. But when PCOL goes HIGH, only the particular cell which is resulted from the intersection between the selected row and selected column is selected. The programmable array 730 is not limited to use in a PLD 700, but can also be used to build memory devices, such as random access memory (RAM).

In case the array of programmable OR gates is used in the PLD architecture 700, the programmable OR array can be implemented in the same fashion as the programmable AND array described above and in FIG. 7.

The construction of the PLD 700 using PLD single-bit cell results in the PLD being fast, consuming zero DC power, and having good noise immunity characteristics.

What is claimed is:

1. A programmable logic device (PLD) single-bit cell comprising:
   a programmable cell unit for storing a single bit, having a plurality of terminals;
   a settable latch electrically coupled to the programmable cell unit to latch the single bit from the programmable cell unit into the settable latch;
   an output logic gate coupled to the settable latch;
   a signal-path means for providing a positive feedback between the settable latch and the programmable cell unit, said signal path means being electrically coupled between the programmable cell unit and the output logic gate; and
   a verifying means electrically coupled to the settable latch for verifying the content of the programmable cell unit.

2. The PLD single-bit logic cell of claim 1, wherein the verifying means comprises a third N channel MOS transistor having a gate coupled to the signal-path means, a drain coupled to a verify column (VCOL) terminal, and a source coupled to an electrical ground.

3. The PLD single-bit logic cell of claim 1, wherein the output logic gate is a NAND gate having a first input terminal, a second input terminal, and an output terminal, and wherein the first input terminal is coupled to an IT terminal, the second input terminal is coupled to the signal-path means, and the output terminal forms an output terminal of the PLD single-bit cell.

4. The PLD single-bit cell of claim 3, wherein the signal-path means is a CMOS inverter having an input terminal and an output terminal, wherein the input terminal is coupled to the programmable cell unit and to the settable latch to provide a signal path from the programmable cell unit to the output logic circuit, and wherein the output terminal of the CMOS inverter is coupled to the second input terminal of the output logic circuit and forming the positive feedback between the output of the CMOS inverter and the settable latch.

5. A programmable logic device (PLD) single-bit cell comprising:
   a programmable cell unit for storing a single bit, having a plurality of terminals;
   a settable latch electrically coupled to the programmable cell unit to latch the single bit from the programmable cell unit into the settable latch, wherein the settable latch is a sense amplifier latch which further comprises a first p-channel MOS transistor coupled in parallel to a second p-channel MOS transistor, wherein a drain of the first p-channel MOS transistor is coupled to a drain of the second p-channel MOS transistor and to a power supply Vdd, a source of the first p-channel MOS transistor is coupled to a source of the second p-channel MOS transistor and to the signal-path means, a gate of the first p-channel CMOS transistor forming an input (IN) terminal, and the gate of the second p-channel MOS transistor being coupled to a verifying means and the signal path means;
   an output logic gate coupled to the settable latch; and
   a signal-path means for providing a positive feedback between the settable latch and the programmable cell unit, said signal path means being electrically coupled between the programmable cell unit and the output logic gate.

6. A programmable logic device (PLD) single-bit cell comprising:
   a programmable flash cell unit for storing a single bit, having a plurality of terminals including a programmable word line (PWL) terminal and a programmable column (PCOL) terminal;
   a settable latch electrically coupled to the programmable cell unit to latch the single bit from the programmable cell unit into the settable latch;
   an output logic gate coupled to the settable latch;
   a signal-path means for providing a positive feedback between the settable latch and the programmable cell unit, said signal path means being electrically coupled between the programmable cell unit and the output logic gate;
   wherein the programmable flash cell unit further comprises a first N channel MOS transistor, a floating gate transistor, and a second N channel MOS transistor; wherein:
   a gate of the first N channel MOS transistor is coupled to an IN terminal and to the settable latch, a drain of the first N channel MOS transistor is coupled to he settable latch;
   the drain of the floating gate transistor is coupled to the source of the first N channel MOS transistor, the gate of the floating gate transistor is coupled to a Vref terminal; and
   the drain of the second N channel MOS transistor is coupled to the source of the floating gate transistor, the gate of the second N channel MOS is coupled to the PWL terminal, and the source is coupled to the PCOL terminal.

7. A programmable logic device (PLD), comprising:
   a) a plurality of PLD single-bit logic cells forming a programmable array, wherein each PLD single-bit cell having:

i) a programmable flash cell unit for storing a bit, said programmable flash cell having a programming word line (PWL) and a programming column (PCOL) terminal;

ii) a sense amplifier latch having an input terminal (IN) and being electrically coupled to the programmable flash cell unit to amplify and latch in the electrical information from the flash cell unit into the sense amplifier latch;

iii) a verifying means having a voltage column (VCOL) terminal and being electrically coupled to the sense amplifier latch for verifying the content of the flash cell unit, an output logic gate coupled to the sense amplifier latch; and iv) an output logic gate having an output (OUT) terminal and an input-term (IT) terminal and being coupled to the sense amplifier latch;

v) a signal-path means for providing a positive feedback between the latch sense amplifier and the flash cell unit, said signal path means being electrically coupled between the flash cell unit and the output logic gate; and b) an array of OR gates having a plurality of input terminals and output terminals, wherein the input terminals are coupled to the programmable array; and c) an array of output logic circuits having input terminals coupled to the output terminals of the array of OR gates.

8. The PLD of claim 7, wherein the sense amplifier latch further comprises a first p-channel MOS transistor coupled in parallel to a second p-channel MOS transistor, wherein a drain of the first p-channel MOS transistor is coupled to a drain of the second p-channel MOS transistor and to a power supply Vdd, a source of the first P channel MOS transistor is coupled to a source of the second p-channel MOS transistor and to the signal-path means, a gate of the first p-channel CMOS transistor forming the IN terminal, and the gate of the second p-channel MOS transistor being coupled to the verifying means and the signal path means.

9. The PLD of claim 7, wherein the programmable flash cell unit further comprises a first N channel MOS transistor, a floating gate transistor, and a second N channel MOS transistor, wherein:

a gate of the first N channel MOS transistor is coupled to the IN terminal and to the sense amplifier latch, a drain of the first N channel MOS transistor is coupled to the sense amplifier latch;

the drain of the floating gate transistor is coupled to the source of the first N channel MOS transistor, the gate of the floating gate transistor is coupled to the Vref terminal; and the drain of the second N channel MOS transistor is coupled to the source of the floating gate transistor, the gate of the second N channel MOS is coupled to the PWL terminal, and the source is coupled to the PCOL terminal.

10. The PLD of claim 7, wherein the verifying means comprises a third N channel MOS transistor having a gate coupled to the signal-path means, a drain coupled to the VCOL terminal, and a source coupled to an electrical ground.

11. The PLD of claim 7, wherein the output circuitry is a NAND gate having a first input terminal, a second input terminal, and an output terminal, and wherein the first input terminal is coupled to the IT terminal, the second input terminal is coupled to the signal-path means, and the output terminal forms the output terminal of the PLD single-bit cell.

12. The PLD of claim 7, wherein the signal-path means is a CMOS inverter having an input terminal and an output terminal, wherein the input terminal is coupled to the flash cell unit and to the sense amplifier latch to provide a signal path from the flash cell unit to the logic output circuit, and wherein the output terminal of the inverter is coupled to the second input terminal of the output logic circuit and forming the positive feedback between the output of the inverter and the sense amplifier latch.

13. The PLD of claim 7, wherein the array of OR gates includes:

a plurality of fixed OR logic gates each comprises an input terminal and an output terminal.

14. The PLD of claim 7, wherein the array of OR gates further comprises a programmable OR array.

15. The PLD of claim 7, wherein the programmable OR array comprises a plurality of PLD single-bit cells.

16. A programmable memory array comprising a plurality of rows and columns wherein an intersection between a row and column forms a single-bit cell, and wherein each column comprises a bit-by N cell, and N is an integer greater than 1, wherein each single-bit cell comprises a programmable flash cell unit for storing a single bit, said programmable flash cell having a programming word line (PWL) and a programming column (PCOL) terminal;

a sense amplifier latch having an input terminal (IT) and being electrically coupled to the programmable flash cell unit to amplify and latch the single bit from the flash cell unit into the sense amplifier latch;

a verifying means electrically having a voltage column (VCOL) terminal and being coupled to the sense amplifier latch for verifying the content of the flash cell unit;

an output logic gate having an output (OUT) terminal and an input-term IT terminal and being coupled to the sense amplifier latch;

a single-path means for providing a positive feedback between the sense amplifier latch and the flash cell unit, said signal path means being electrically coupled between the flash cell unit and the output logic gate; and wherein the sense amplifier latch further comprises a first p-channel MOS transistor coupled in parallel to a second p-channel MOS transistors wherein a drain of the first p-channel MOS transistor is coupled to a drain of the second p-channel MOS transistor and to a power supply Vdd, a source of the first p-channel MOS transistor is coupled to a source of the second p-channel MOS transistor and to the signal-path means, a gate of the first p-channel CMOS transistor forming the IN terminal, and the gate of the second p-channel MOS transistor being coupled to the verifying means and the signal path means.

17. The memory array of claim 16, wherein the bit-by-N cells is a bit-by-44 cell.

18. The programmable memory array of claim 16, wherein each of the plurality of bit-by-44 comprises a first bit-by-16, a second bit-by-16, a bit-by-12, a NAND gate, and an inverter; wherein the first bit-by-16 AND gate, the second bit-by-16 AND gate, the bit-by-12 AND gate are coupled together and to input terminals of the NAND gate, and an output terminal of the NAND gate is coupled to an input terminal of the inverter.

19. The programmable memory array of claim 18, wherein the bit-by-16 further comprises a first bit-by-4 AND gate, a second bit-by-4 AND gate, a third bit-by-4 AND gate, a fourth bit-by-4 AND gate, a NAND gate, and an inverter;

wherein all four bit-by-4 AND gates are coupled together and to input terminals of the NAND gate, an output of the NAND gate is coupled to an input of the inverter.

20. The programmable memory array of claim 19, wherein a bit-by-4 further comprises a first PLD single-bit cell, a second PLD single-bit cell, a third PLD single-bit cell, a fourth PLD single-bit cell, a NAND gate, and an inverter; wherein all PLD single-bit cells are coupled together and to input terminals of the NAND gate, and an output of the NAND gate is coupled to an input terminal of the inverter.

21. The programmable memory array of claim 18, wherein the bit-by-12 comprises a first bit-by-4 AND gate, a second bit-by-4 AND gate, a third bit-by-4 AND gate, NAND gate, and an inverter; wherein all three bit-by-4 AND are coupled together and to input terminals of the NAND gate, and an output of the NAND gate is coupled to an input of the inverter.

22. The programmable memory array of claim 16, wherein the programmable flash cell unit further comprises a first N channel MOS transistor, a floating gate transistor, and a second N channel MOS transistor; wherein:

a gate of the first N channel MOS transistor is coupled to the IN terminal and to the sense amplifier latch, a drain of the first N channel MOS transistor is coupled to the sense amplifier latch;

the drain of the floating gate transistor is coupled to the source of the first N channel MOS transistor, the gate of the floating gate transistor is coupled to the Vref terminal; and the drain of the second N channel MOS transistor is coupled to the source of the floating gate transistor, the gate of the second N channel MOS is coupled to the PWL terminal, and the source is coupled to the PCOL terminal.

23. The programmable memory array of claim 16, wherein the verifying means comprises a third N channel MOS transistor having a gate coupled to the signal-path means, a drain coupled to the VCOL terminal, an a source coupled to an electrical ground.

24. The programmable memory array of claim 16, wherein the output logic gate is a NAND gate having a first input terminal, a second input terminal, and an output terminal, and wherein the first input terminal is coupled to the IT terminal, the second input terminal is coupled to the signal-path means, and the output terminal forms the output terminal of the PLD single-bit cell.

25. The programmable memory array of claim 16, wherein the signal-path means is a CMOS inverter having an input terminal and an output terminal, wherein the input terminal is coupled to the flash cell unit and to the sense amplifier latch to provide a signal path from the flash cell unit to the output logic circuit, and wherein the output terminal of the CMOS inverter is coupled to the second input terminal of the output logic circuit and forming the positive feedback between the output of the CMOS inverter and the sense amplifier latch.

* * * * *